(12) United States Patent
Chun (10) Patent No.: US 8,952,514 B2
(45) Date of Patent: Feb. 10, 2015

(54) SEMICONDUCTOR PACKAGE

(75) Inventor: Jung Hwan Chun, Chungcheongnam-Do (KR)

(73) Assignee: STS Semiconductor & Telecommunications Co., Ltd. (KR)

( * ) Notice: Subject to any disclaimer, the term of this patent is extended or adjusted under 35 U.S.C. 154(b) by 77 days.

(21) Appl. No.: 13/458,397

(22) Filed: Apr. 27, 2012

(65) Prior Publication Data

US 2013/0082405 A1 Apr. 4, 2013

(30) Foreign Application Priority Data

Sep. 30, 2011 (KR) .......................... 10-2011-0100350

(51) Int. Cl.
*H01L 23/02* (2006.01)
*H01L 23/495* (2006.01)
(Continued)

(52) U.S. Cl.
CPC .... *H01L 23/49537* (2013.01); *H01L 23/49575* (2013.01); *H01L 25/105* (2013.01); *H01L 2224/32145* (2013.01); *H01L 2224/48247* (2013.01); *H01L 2224/73265* (2013.01); *H01L 2225/1029* (2013.01); *H01L 2225/1058* (2013.01); *H01L 2924/18165* (2013.01); *H01L 2224/85005* (2013.01); *H01L 24/49* (2013.01); *H01L 2224/49171* (2013.01); *H01L 2224/92247* (2013.01); *H01L 2225/06562* (2013.01)
USPC ............................ 257/686; 257/666; 257/676

(58) Field of Classification Search
CPC ........... H01L 2224/48247; H01L 2224/32145; H01L 2224/1308; H01L 23/495; H01L 21/4821; H01L 2924/14

USPC .................. 257/666, 676, 686, 777, 723, 724
See application file for complete search history.

(56) References Cited

U.S. PATENT DOCUMENTS 5,463,253 A * 10/1995 Waki et al. .................... 257/724
5,530,292 A * 6/1996 Waki et al. .................... 257/724
5,793,108 A * 8/1998 Nakanishi et al. ............ 257/723
(Continued)

FOREIGN PATENT DOCUMENTS

JP        2001185651 A    7/2001
KR   20020013286 A    2/2002
(Continued)

OTHER PUBLICATIONS

Korean Intellectual Property Office Non-Final Rejection (English Translation) Application No. KR 10-2011-0100350 Dated: Jan. 15, 2013 4 pages.
(Continued)

*Primary Examiner* — S. V. Clark
(74) *Attorney, Agent, or Firm* — St. Onge Steward Johnston & Reens LLC (57) ABSTRACT

A semiconductor package including a first package having a first semiconductor chip, a plurality of first inner leads electrically connected to the first semiconductor chip, and a plurality of first outer leads extending from the first inner leads and electrically connected to an external apparatus; and a second package having a second semiconductor chip and a plurality of second inner leads electrically connected to the second semiconductor chip, wherein an inactive surface of the first semiconductor chip and an inactive surface of the second semiconductor chip face each other, and the first inner leads contact the second inner leads to be electrically connected to each other.

11 Claims, 7 Drawing Sheets

(51) Int. Cl.
  *H01L 25/10* (2006.01)
  *H01L 23/00* (2006.01)

(56) References Cited

U.S. PATENT DOCUMENTS

| | | | |
|---|---|---|---|
| 6,229,200 B1 * | 5/2001 | Mclellan et al. | 257/666 |
| 6,972,372 B1 * | 12/2005 | Tsai et al. | 174/551 |
| 7,071,545 B1 * | 7/2006 | Patel et al. | 257/686 |
| 8,043,894 B2 * | 10/2011 | Tay et al. | 438/109 |
| 8,395,251 B2 * | 3/2013 | Shim et al. | 257/686 |
| 8,513,542 B2 * | 8/2013 | Kuan et al. | 174/529 |
| 2002/0074638 A1 * | 6/2002 | Liao et al. | 257/686 |
| 2005/0184380 A1 * | 8/2005 | Sakuma et al. | 257/686 |
| 2007/0108568 A1 * | 5/2007 | Shim et al. | 257/676 |
| 2007/0108571 A1 * | 5/2007 | Huang et al. | 257/676 |
| 2008/0136008 A1 * | 6/2008 | Yoon et al. | 257/686 |

FOREIGN PATENT DOCUMENTS

| | | |
|---|---|---|
| KR | 100421774 B1 | 3/2004 |
| KR | 100833183 B1 | 5/2008 |

OTHER PUBLICATIONS

Korean Intellectual Property Office Notice of Allowance Application No. KR 10-2011-0100350 Dated: Jul. 18, 2013 7 pages.

* cited by examiner

SEMICONDUCTOR PACKAGE

CROSS-REFERENCE TO RELATED APPLICATIONS

This application claims the benefit of Korean Patent Application No. 10-2011-0100350, filed on Sep. 30, 2011, in the Korean Intellectual Property Office, the disclosure of which is incorporated herein in its entirety by reference.

FIELD OF THE INVENTION

The present invention relates to a semiconductor package, and more particularly, to a semiconductor package in which an upper package and a lower package are electrically connected to each other.

BACKGROUND OF THE INVENTION

Recently, as information technology (IT) equipments require high capacity, demands for high-capacity semiconductor packages, such as a NAND flash memory, are increasing. However, during a process of stacking a plurality of semiconductor chips on both surfaces of a substrate, the process becomes complicated and a yield is decreased. In other words, if any one of the plurality of semiconductor chips has a defect, the entire semiconductor package is discarded and it is difficult to perform a rework process, thereby resulting in an increase in manufacturing costs.

SUMMARY OF THE INVENTION

The present invention provides a semiconductor package that may reduce manufacturing costs by facilitating a rework process when defects occur during an electrical test of the semiconductor package.

According to an aspect of the present invention, there is provided semiconductor package including: a first package including a first semiconductor chip, a plurality of first inner leads electrically connected to the first semiconductor chip, and a plurality of first outer leads extending from the first inner leads and electrically connected to an external apparatus; and a second package including a second semiconductor chip and a plurality of second inner leads electrically connected to the second semiconductor chip, wherein an inactive surface of the first semiconductor chip and an inactive surface of the second semiconductor chip face each other, and the first inner leads contact the second inner leads to be electrically connected to each other.

The plurality of first inner leads may be disposed to surround the first semiconductor chip.

The semiconductor package may further include a first molding member formed to cover the first semiconductor chip and the first inner leads and to expose the inactive surface and the first outer leads of the first semiconductor chip.

The plurality of second inner leads may be disposed to surround the second semiconductor chip.

The semiconductor package may further include a second molding member formed to expose surfaces of the second inner leads and the inactive surface of the second semiconductor chip and to cover top surfaces of the second inner leads and the second semiconductor chip.

Bottom surfaces of the first inner leads and the inactive surface of the first semiconductor chip may be formed on the same level.

Bottom surfaces of the second inner leads and the inactive surface of the second semiconductor chip may be formed on the same level.

There may be a plurality of the first semiconductor chips.
There may be a plurality of the second semiconductor chips.

According to another aspect of the present invention, there is provided a semiconductor package including: a lower package portion including a first semiconductor chip, a first inner lead electrically connected to the first semiconductor chip, a first sealing member covering the first semiconductor chip and the first inner lead, and a first outer lead that extends from the first inner lead to be exposed out of the first sealing member and to electrically connect to an external apparatus; and an upper package portion including a second semiconductor chip and a second inner lead electrically connected to the second semiconductor chip, wherein the second semiconductor chip and the second inner lead are covered by a second molding member, wherein one surface of the first inner lead of the lower package portion and one surface of the second inner lead of the upper package are electrically connected to each other, and an inactive surface of the first semiconductor chip and an inactive surface of the second semiconductor chip face each other.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The inventive concept will now be described more fully with reference to the accompanying drawings, in which exemplary embodiments of the inventive concept are shown. The inventive concept may, however, be embodied in many different forms by one of ordinary skill in the art without departing from the technical teaching of the inventive concept. In other words, particular structural and functional description of the inventive concept are provided in descriptive sense only; various changes in form and details may be made therein and thus should not be construed as being limited to the embodiments set forth herein. As the inventive concept is not limited to the embodiments described in the present description, and thus it should not be understood that the inventive concept includes every kind of variation examples or alternative equivalents included in the spirit and scope of the inventive concept.

In the present description, terms such as 'first', 'second', etc. are used to describe various elements. However, it is obvious that the elements should not be defined by these terms. The terms are used only for distinguishing one element from another element. For example, a first element which could be termed a second element, and similarly, a second element may be termed a first element, without departing from the teaching of the inventive concept.

It will be understood that when an element is referred to as being "connected to", or "contacting" another element throughout the specification, it can be directly "connected to" or "contacting" the other element, or intervening elements may also be present. On the other hand, when a component is referred to as being "directly connected to" or "directly contacting" another element, it will be understood that no intervening element is present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Expressions such as "at least one of," when preceding a list of elements, modify the entire list of elements and do not modify the individual elements of the list.

Figure 1:
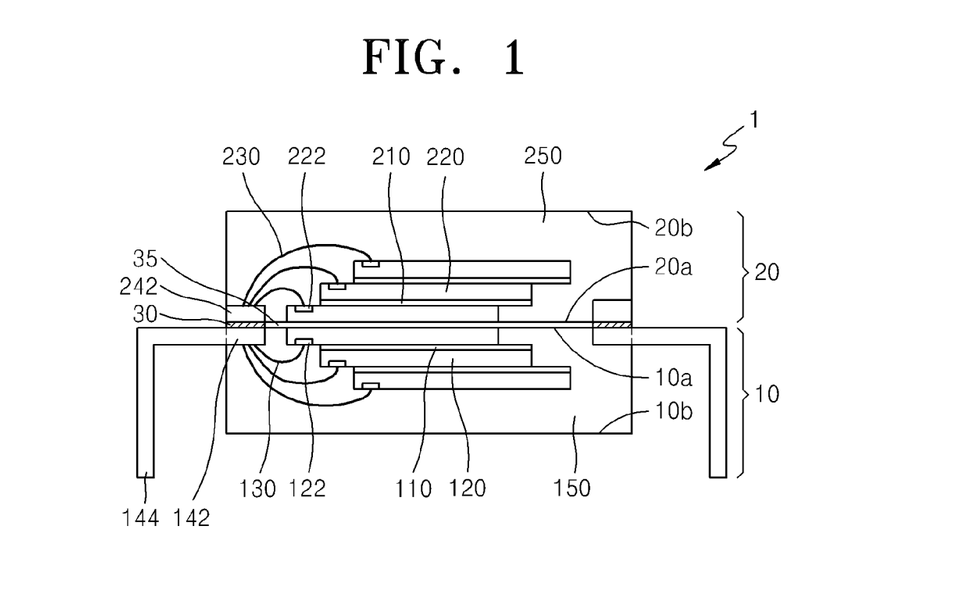
FIG. 1 is a cross-sectional view schematically showing a semiconductor package according to an embodiment of the present invention.

FIG. 1 is a cross-sectional view schematically showing a semiconductor package 1 according to an embodiment of the present invention.

Referring to FIG. 1, the semiconductor package 1 includes a first package 10 and a second package 20. The first package 10 and the second package 20 may be electrically connected to each other by using a conductive adhesive member 30. In other words, a plurality of first inner leads 142 of the first package 10 and a plurality of second inner leads 242 of the second package 20 may be electrically connected to each other by using the conductive adhesive member 30.

The first package 10 and the second package 20 may be spaced apart from each other by a predetermined interval by the conductive adhesive member 30. In other words, an inactive surface, on which the conductive adhesive member 30 is not formed, of a lowermost first semiconductor chip 120 of the first package 10 is spaced apart from an inactive surface, on which the conductive adhesive member 30 is not formed, of a lowermost second semiconductor chip 220 of the second package 20 by a predetermined interval. Alternatively, a filling material 35 may be interposed between the inactive surface of the first semiconductor chip 120 and the inactive surface of the second semiconductor chip 220.

A top surface 10b and a bottom surface 10a of the first package 10 are opposite to each other. The top surface 10b is defined by a first molding member 150. Also, the first package 10 includes a plurality of the first semiconductor chips 120 that are stacked from the bottom surface 10a of the first package 10, the first inner leads 142 electrically connected to the first semiconductor chips 120, and a plurality of first outer leads 144 extending from the first inner leads 142 to be electrically connected to an external apparatus.

An inactive surface of the lowermost first semiconductor chip 120 is exposed to the outside, and thus the lowermost first semiconductor chip 120 may be mounted on the bottom surface 10a of the first package 10. In other words, the first semiconductor chips 120 are not fixedly stacked on a supporting board such as a die pad or a substrate, and the inactive surface of the lowermost first semiconductor chip 120 is exposed to the outside through the first molding member 150 surrounding the first semiconductor chips 120, and thus the first semiconductor chips 120 may be installed in the first package 10. Also, a method of manufacturing the first package 10 of the current embodiment, which is described below, includes stacking the first semiconductor chips 120 on a tape 300 (see FIG. 5) disposed on a supporting substrate 350 (see FIG. 5), forming the first molding member 150 to cover the first semiconductor chips 120 and the first inner leads 142, and removing the supporting substrate 350 and the tape 300.

The first semiconductor chips 120 may include an integrated circuit. For example, the integrated circuit may include a memory circuit or a logic circuit. Also, the first semiconductor chips 120 may be memory chips or non-memory chips. For example, the first semiconductor chips 120 may include a controller, a flash memory, a parameter random access memory (PRAM), a resistive RAM (RRAM), a ferroelectric RAM (FeRAM), a magnetic RAM (MRAM), a dynamic RAM (DRAM), and the like.

Although FIG. 1 shows the first package 10 in which the plurality of first semiconductor chips 120 are stacked, the present invention is not limited thereto. That is, the first package 10 may include only one first semiconductor chip 120.

Also, a first adhesion layer 110 may be interposed between the first semiconductor chips 120. The first semiconductor chips 120 may be stacked via the first adhesion layer 110.

In addition, active surfaces of the first semiconductor chips 120 may include a plurality of first pads 122 connected to the integrated circuits included in first semiconductor chips 120. The first pads 122 may be formed of a metal, for example, aluminum (Al), copper (Cu), silver (Ag), gold (Au), palladium (Pd), or the like.

The first semiconductor chips 120 may be electrically connected to the first inner leads 142 by using a plurality of first connecting members 130. The first connecting members 130 may be, for example, a bonding wire or the like.

The first molding member 150 may be formed from the bottom surface 10a to cover the first semiconductor chips 120 and the first inner leads 142.

The first molding member 150 may cover the first semiconductor chips 120 to protect the first semiconductor chips 120 and may fix the first semiconductor chips 120 to the bottom surface 10a without using a die pad or a substrate. The first molding member 150 may be formed of any of various synthetic resins including an epoxy resin, a hardening agent, an organic/inorganic filler, and the like, and may be formed in a mold by using an injection molding method. The first molding member 150 may be formed of a polymer such as a resin, for example, epoxy molding compound (EMC).

The first semiconductor chips 120 may be electrically connected to an external apparatus such as a mother-board via the first connecting members 130, the first inner leads 142, and the first outer leads 144 extending from the first inner leads 142 and the first molding member 150 to the outside.

A top surface 20b and a bottom surface 20a of the second package 20 are opposite to each other. The top surface 20b is defined by a second molding member 250. The second package 20 may also include a plurality of the second semiconductor chips 220 that are stacked from the bottom surface 20a of the second package 20, and the second inner leads 242 electrically connected to the second semiconductor chips 220.

The first package 10 and the second package 20 may be electrically connected to each other by using the conductive adhesive member 30. The conductive adhesive member 30 may be, for example, a solder paste or the like. In other words, the conductive adhesive member 30 may be interposed between the first inner leads 142 of the first package 10 and the second inner leads 242 of the second package 20.

Since the second package 20 is electrically connected to the first package 10 via the second inner leads 242, the second package 20 may not include an outer lead unlike the first package 10.

An inactive surface of the lowermost second semiconductor chip 220 is exposed out of the second package 20, and thus the second semiconductor chips 220 may be mounted on the bottom surface 20a of the second package 20. In other words, the first semiconductor chips 120 are not fixedly stacked on a supporting board such as a die pad or a substrate, and the inactive surface of the lowermost first semiconductor chip 120 is exposed to the outside through the first molding member 150 surrounding the first semiconductor chips 120, and thus the first semiconductor chips 120 may be installed in the first package 10.

The second semiconductor chips 220 may include an integrated circuit. For example, the integrated circuit may include a memory circuit or a logic circuit. Also, the second semiconductor chips 220 may be memory chips or non-memory chips. For example, the second semiconductor chips 220 may include a controller, a flash memory, a PRAM, a RRAM, a FeRAM, a MRAM, a DRAM, and the like.

Although FIG. 1 shows the second package 20 in which the plurality of second semiconductor chips 220 are stacked, the present invention is not limited thereto. That is, the second package 20 may include only one second semiconductor chip 220.

In addition, a second adhesion layer 210 may be formed between the second semiconductor chips 220, and the second semiconductor chips 220 may be stacked on the bottom surface 20a of the second package 20 via the second adhesion layers 210.

Also, active surfaces of the second semiconductor chips 220 may include at least one second pad 222 connected to the integrated circuits included in the second semiconductor chips 220. The second pad 222 may be formed of a metal, for example, Al, Cu, Ag, Au, Pd, or the like.

The second semiconductor chips 220 may be electrically connected to the second inner leads 242 by using the second connecting members 230. The second connecting members 230 may be, for example, a bonding wire or the like.

The second molding member 250 may be formed from the bottom surface 20a to cover the second semiconductor chips 220 and the second inner leads 242.

The second molding member 250 may cover the second semiconductor chips 220 to protect the second semiconductor chips 220 and may fix the second semiconductor chips 220 to the bottom surface 20a without using a die pad or a substrate. The second molding member 250 may be formed of any of various synthetic resins including an epoxy resin, a hardening agent, an organic/inorganic filler, and the like, and may be formed in a mold by using an injection molding method. The second molding member 250 may be formed of a polymer such as a resin, for example, EMC.

The second semiconductor chips 220 may be electrically connected to the first inner leads 142 of the first package 10 via the second connecting members 230 and the second inner leads 242.

Also, the first package 10 and the second package 20 may be coupled to each other by using the conductive adhesive member 30, and may be spaced apart from each other by an interval corresponding to a thickness of the conductive adhesive member 30. In other words, the inactive surface, on which the conductive adhesive member 30 is not disposed, of the first semiconductor chip 120 may be spaced apart from the inactive surface, on which the conductive adhesive member 30 is not disposed, of the second semiconductor chip 220 by a predetermined interval.

Also, both bottom surfaces of the first inner leads 142 of the first package 10 and bottom surfaces of the second inner leads 242 of the second package 20, which are coupled to each other via the conductive adhesive member 30, include a metal wiring line.

In addition, the filling material 35 may be interposed between the inactive surface of the first semiconductor chip 120 and the inactive surface of the second semiconductor chip 220. The filling material 35 may be, for example, an adhesive material.

In the semiconductor package 1 of the current embodiment, a plurality of semiconductor chips are not stacked on a top surface and a bottom surface of a single die pad or a single substrate, and the first package 10 and the second package 20 are independently formed. Accordingly, since an electrical test, for example, a direct-current (DC) test, may be independently performed with respect to the first and second packages 10 and 20, it may be determined whether the first and second packages 10 and 20 have defects before manufacturing the semiconductor package 1 by coupling the first package 10 and the second package 20.

Therefore, only the first package 10 and the second package 20 that have passed the electrical test may be coupled to each other via the conductive adhesive member 30, thereby forming the semiconductor package 1 of the present invention.

Furthermore, after the semiconductor package 1, including the first package 10 and the second package 20, is formed, it may be determined whether the semiconductor package 1 normally operates by performing a full test including a function of the semiconductor package 1. When an error occurs in the full test, the semiconductor package 1 is not discarded. The first package 10 and the second package 20 coupled to each other via the conductive adhesive member 30 may be separated from each other and the semiconductor package 1 may be formed by performing a rework process, thereby increasing manufacturing yield and reducing manufacturing costs.

The present invention is characteristic in that the semiconductor package 1 is formed by coupling the first package 10 and the second package 20, which are independently formed by using a lead frame not including a die pad, to each other, and thus a structure of the lead frame used in the present invention will now be described.

Figure 2:
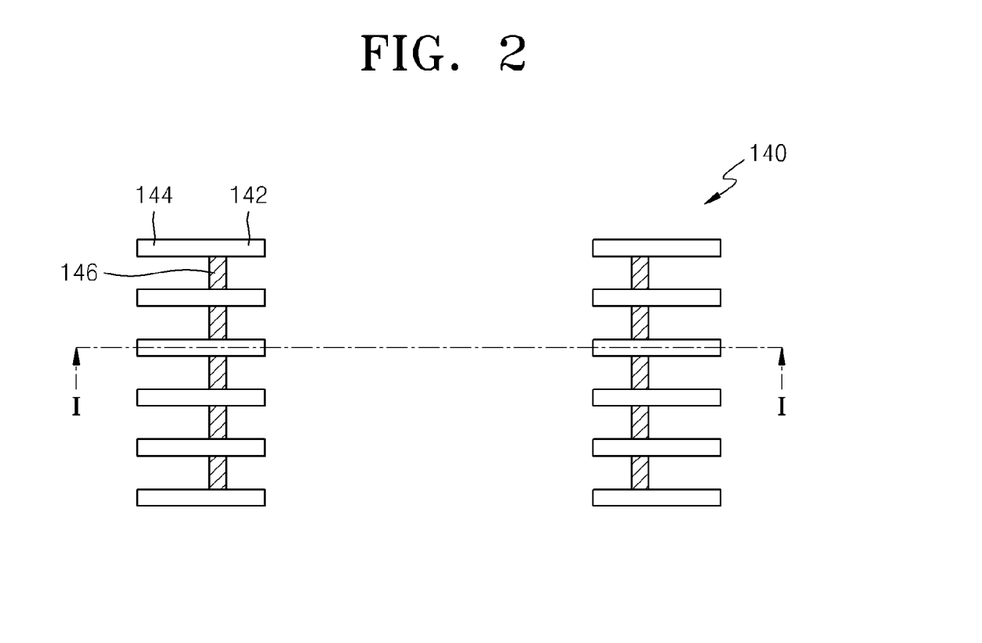
FIG. 2 is a plane view schematically showing a lead frame for forming first and second packages according to an embodiment of the present invention.

FIG. 2 is a plane view schematically showing a first lead frame 140 for forming the first and second packages 10 and 20 of FIG. 1 according to an embodiment of the present invention.

Referring to FIGS. 1 and 2, the first lead frame 140 includes the first inner leads 142, the first outer leads 144, and a first dam bar 146.

The first lead frame 140 may be manufactured by patterning a metallic plate, for example, a copper plate.

The first dam bar 146 prevents the first molding member 150 from leaking out of the first inner leads 142 during the molding process of the first semiconductor chips 120. Also, the first dam bar 146 supports the entire first lead frame 140 including the first inner leads 142 and the first outer leads 144 that are arranged at both sides of the first dam bar 146.

The first inner leads 142 may be electrically connected to the first pads 122 of the first semiconductor chip 120, which are mounted in the first lead frame 140, by using the first connecting members 130. The first connecting members 130 may be, for example, a bonding wire or the like. In order to electrically connect the first inner leads 142 to the first pads 122, a plating layer having a predetermined area may be formed on a top surface of each first inner lead 142. In this regard, the plating layer may be an Ag plating layer.

The first outer leads 144 extend from the first inner leads 142 to be electrically connected to an external apparatus or a printed circuit board (PCB). Also, after manufacture of the first package 10 is completed, an electrical test may be performed on the first package 10 through the first outer leads 144. However, the present invention is not limited thereto, and an electrical test may also be performed on the first package 10 through the first inner leads 142.

FIGS. 3 to 7, 9, and 11 are cross-sectional views showing a method of manufacturing the first package 10 of the semiconductor package of FIG. 1. FIGS. 3 to 7, 9, and 11 are cross-sectional views showing a method of manufacturing the first package 10 on the first lead frame 140 taken along a line I-I of FIG. 2.

Figure 3:
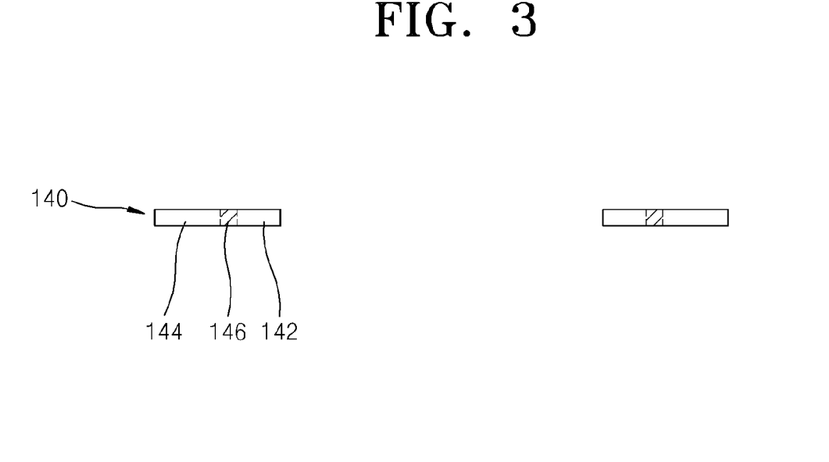
FIGS. 3 to 7 are cross-sectional views showing a method of manufacturing the first package of the semiconductor package of FIG. 1.

Referring to FIG. 3, the first lead frame 140 including the first inner leads 142, the first dam bar 146, and the first outer leads 144 is prepared.

The first lead frame 140 may be manufactured by patterning a metallic plate, for example, a copper plate. Also, the first inner leads 142, the first dam bar 146, and the first outer leads 144 may be formed as one body.

Figure 4:
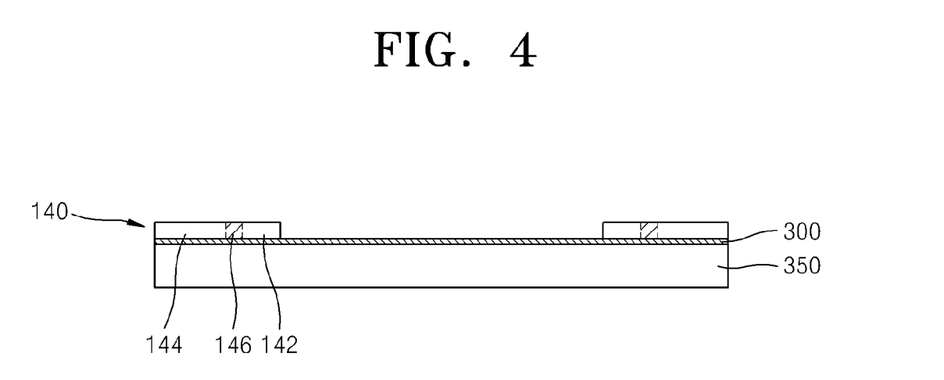

Referring to FIG. 4, the supporting substrate 350 on which the tape 300 is disposed is prepared, and then a bottom surface of the first lead frame 140 is attached to the tape 300. One surface of the tape 300 may include an adhesive member for adhering to the first lead frame 140 and the first semiconductor chips 120 (see FIG. 5). Also, the first lead frame 140 of the current embodiment does not include a die pad on which a semiconductor chip is mounted. Accordingly, in order to install the semiconductor chip in the first lead frame 140, the tape 300 is attached to the bottom surface of the first lead frame 140.

Figure 5:
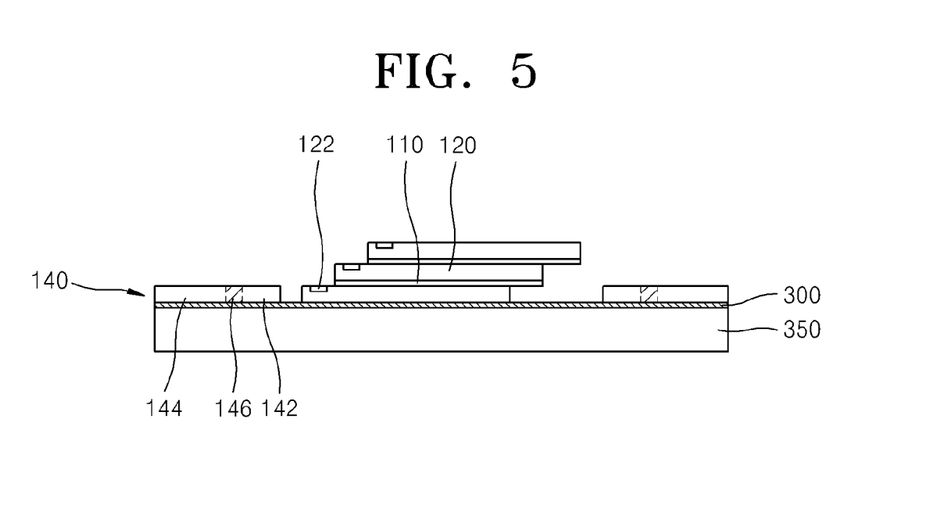

Referring to FIG. 5, the first semiconductor chip 120 is mounted on one surface of the tape 300, and another first semiconductor chip 120 is mounted on the first semiconductor chip 120 by using the first adhesion layer 110.

The first semiconductor chips 120 may include an integrated circuit. For example, the integrated circuit may include a memory circuit or a logic circuit.

Also, the first semiconductor chips 120 may be memory chips or non-memory chips. For example, the first semiconductor chips 120 may include a controller, a flash memory, a PRAM, a RRAM, a FeRAM, a MRAM, a DRAM, and the like.

Although FIG. 5 shows the plurality of first semiconductor chips 120 stacked on the tape 300, the present invention is not limited thereto. That is, only one first semiconductor chip 120 may be stacked on the tape 300.

The inactive surface of the first semiconductor chip 120 may include the first adhesion layer 110 facing the tape 300, and the active surface of the first semiconductor chip 120 may include at least one first pad 122 connected to the integrated circuit included in the first semiconductor chip 120. The first pad 122 may be formed of a metal, for example, Al, Cu, Ag, Au, Pd, or the like.

Figure 6:
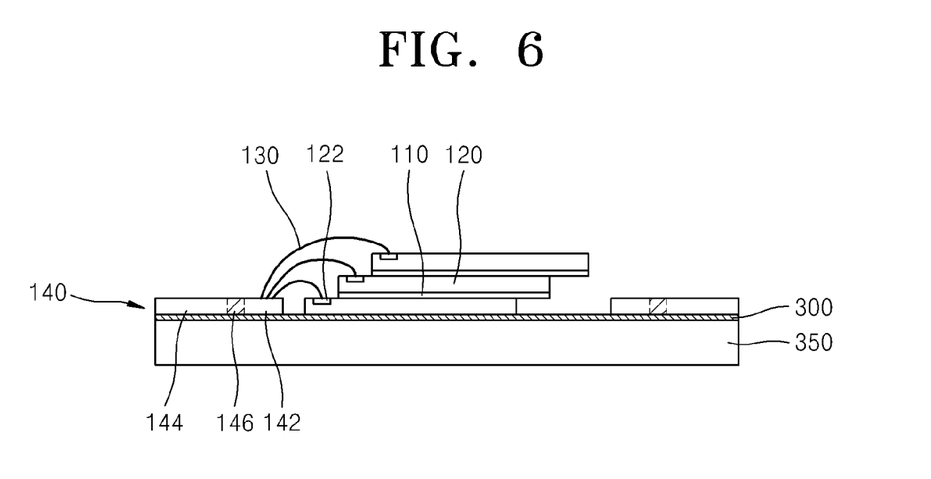

Referring to FIG. 6, the first semiconductor chip 120 may be electrically connected to the first inner leads 142 by using the first connecting members 130. The first connecting members 130 may be, for example, a bonding wire or the like.

Figure 7:
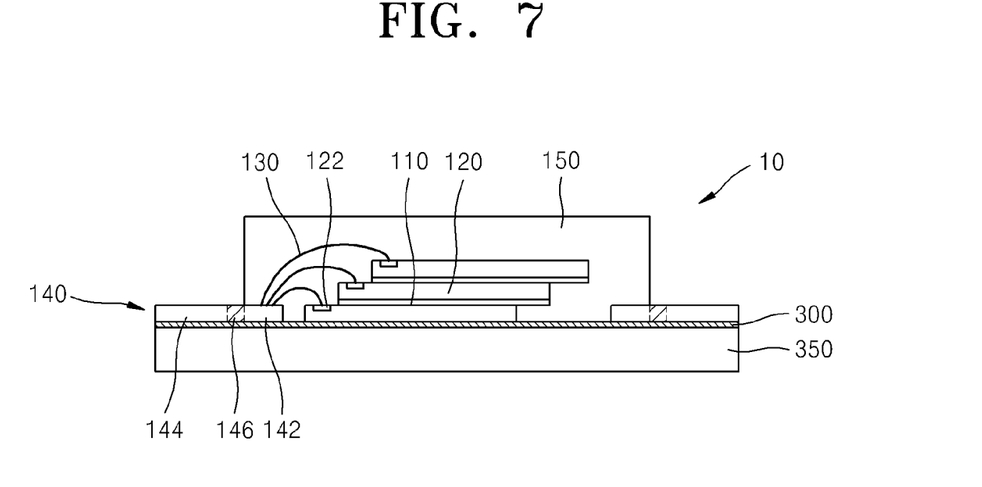

Referring to FIG. 7, the first molding member 150 of the first package 10 may be formed to cover the first semiconductor chip 120 and the first inner leads 142, thereby preventing the first molding member 150 from leaking out of the first inner leads 142 through the first dam bar 146.

The first molding member 150 may cover the first semiconductor chip 120 and the first inner leads 142 to protect the first semiconductor chip 120 and the first inner leads 142. The first molding member 150 may be formed of any of various synthetic resins including an epoxy resin, a hardening agent, an organic/inorganic filler, and the like, and may be formed in a mold by using an injection molding method. The first molding member 150 may be formed of a polymer such as a resin, for example, EMC.

In addition, since a state where the first semiconductor chips 120 are mounted on the tape 300 is maintained by the first molding member 150, even if the tape 300 is removed, the state where the first semiconductor chips 120 are mounted on the tape 300 may be maintained.

Figure 8:
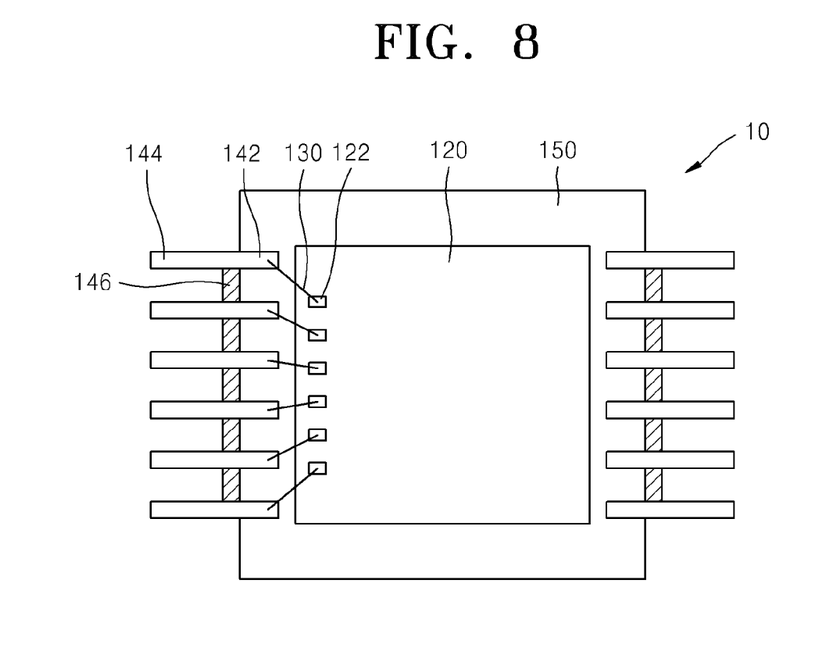
FIG. 8 is a plane view schematically showing the first package of FIG. 7.

FIG. 8 is a plane view schematically showing the first package 10 of FIG. 7. Referring to FIG. 8, in the first package 10, a molding area of the first molding member 150 is defined by the first dam bar 146, and the first semiconductor chips 120 are electrically connected to the first inner leads 142 via the first connecting members 130.

Figure 9:
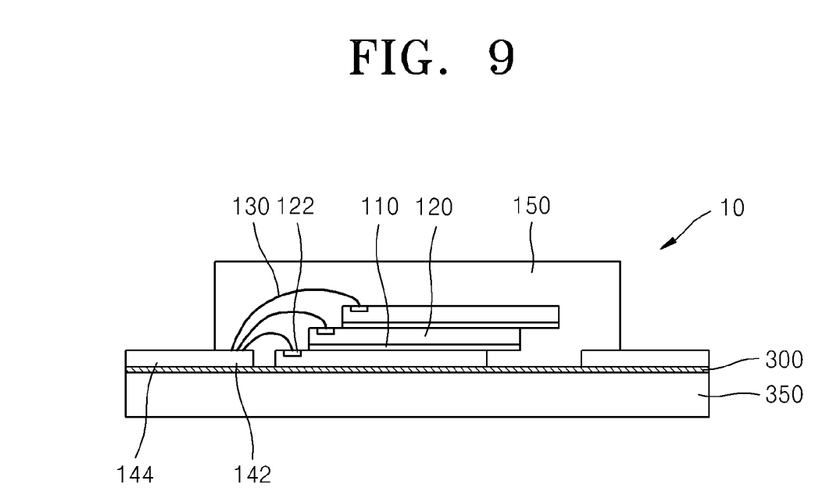
FIG. 9 is a cross-sectional view for describing a method of manufacturing the first package of the semiconductor package of FIG. 1.
Figure 10:
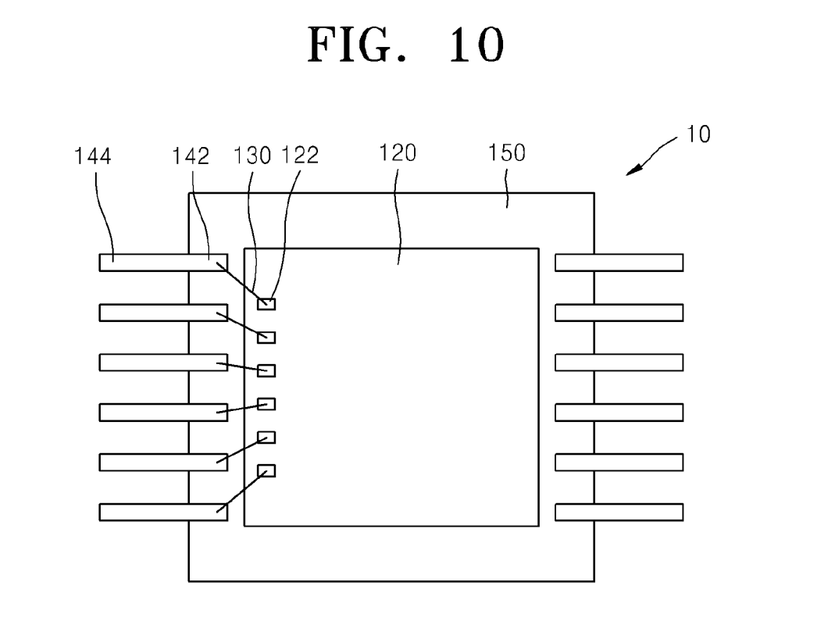
FIG. 10 is a plane view schematically showing the first package of FIG. 9.

Referring to FIGS. 9 and 10, the first dam bar 146 may be cut by performing a trimming process using a blade, a laser, or other molds.

By cutting the first dam bar 146 disposed at both sides of the first inner leads 142 and the first outer leads 144, the first package 10 may electrically separate each of the first inner leads 142 (or the first outer leads 144).

Figure 11:
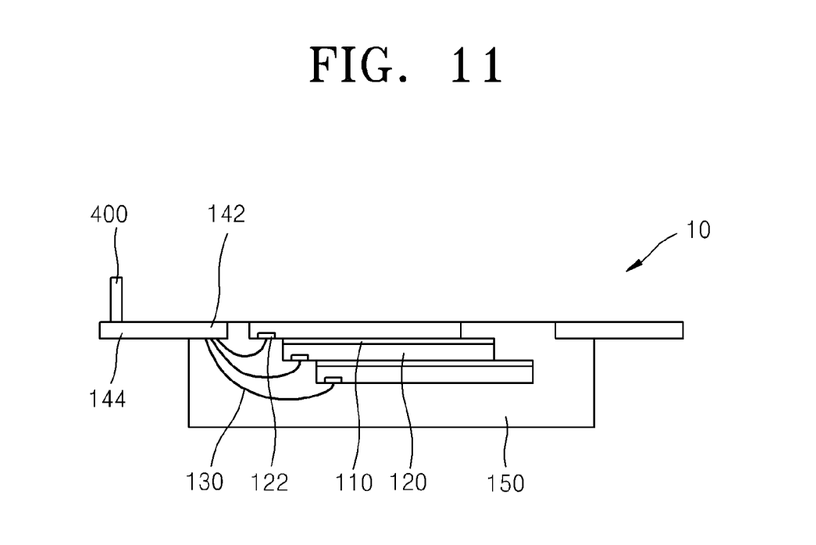
FIG. 11 is a cross-sectional view for describing a method of manufacturing the first package of the semiconductor package of FIG. 1.

Referring to FIGS. 9 and 11, the tape 300 and the supporting substrate 350 are removed from the first package 10.

Next, an electrical test of the first package 10 is performed on the first outer leads 144 by using a test pin 400. However, the present invention is not limited thereto, and the electrical test of the first package 10 may be performed on the first inner leads 142 by using the test pin 400.

The electrical test using the test pin 400 is performed to ascertain whether the first package 10 has a defect, and the electrical test may be, for example, a simple DC test. The electrical test is performed to increase a process speed, and is not limited to the simple DC test. Alternatively, a full test regarding a function of the first package 10 may be performed.

The first package 10 is formed on one surface of the tape 300 in one first lead frame 140 not including a die pad. Accordingly, compared to a process for mounting a semiconductor chip on both sides of a lead frame including a die pad, the process of forming the first package 10 is simple and it may be easily ascertained whether the first package 10 has a defect. Thus, a loss occurring due to the defect may be minimized and a process speed may be improved.

Although the process of cutting the first dam bar 146 and the process of removing the tape 300 and the supporting substrate 350 have been sequentially described, the present invention is not limited thereto. That is, the order of the processes may be changed according to a way of performing the processes.

Figure 12:
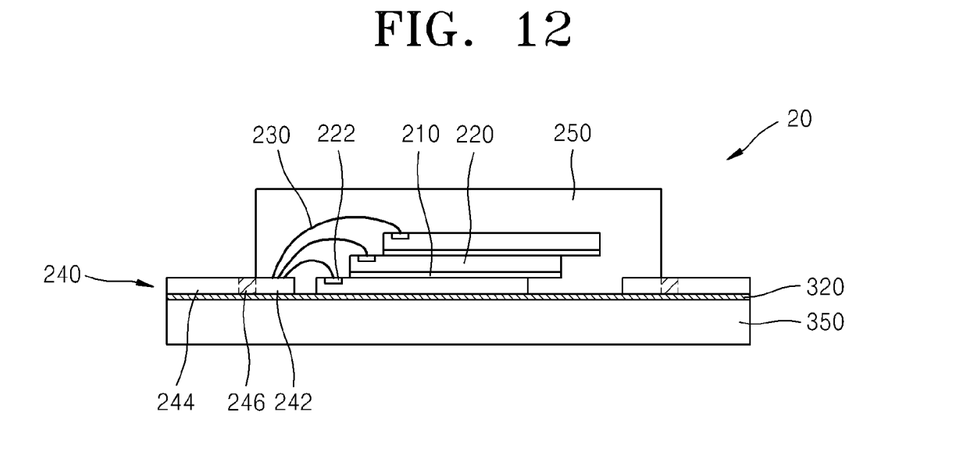
FIGS. 12 and 13 are cross-sectional views schematically showing a method of manufacturing the second package of FIG. 1.
Figure 13:
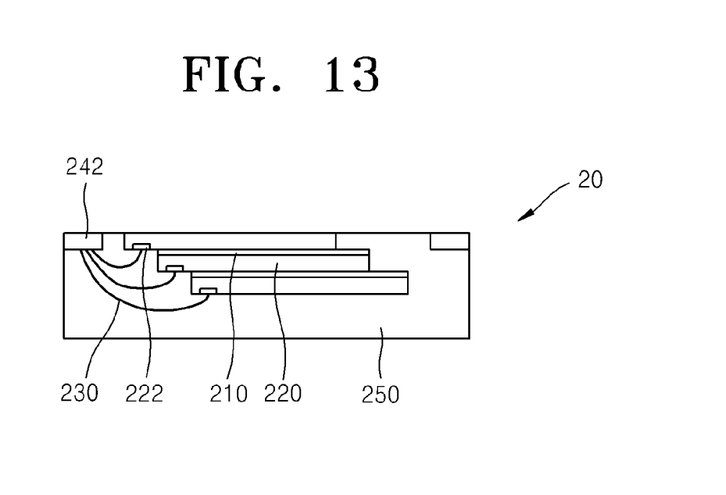
Figure 15:
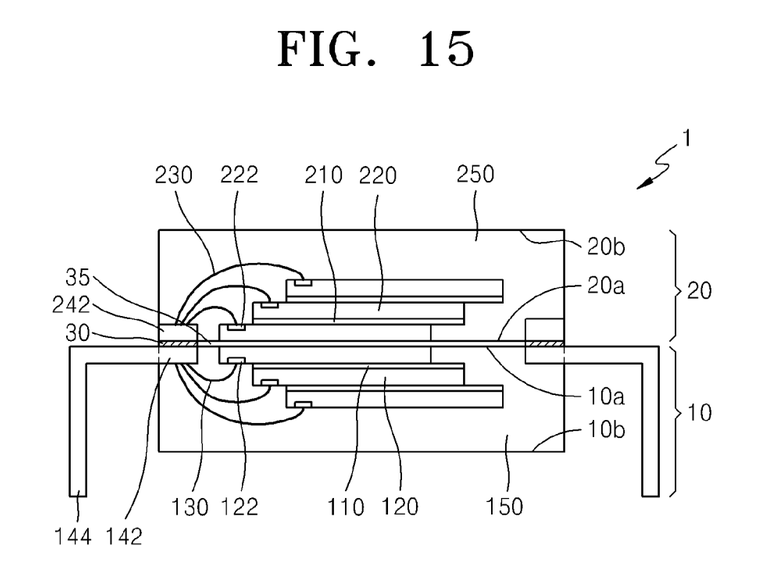
FIG. 15 is a cross-sectional view schematically showing the semiconductor package of FIG. 1 in which the first package and the second package are electrically connected to each other.

FIGS. 12, 13, and 15 are cross-sectional views schematically showing a method of manufacturing the second package 20 of FIG. 1.

Referring to FIG. 12, a second lead frame 240, including the second inner leads 242, the second outer leads 244, and a second dam bar 246, is prepared. The second lead frame 240 may be manufactured by patterning a metallic plate, for example, a copper plate.

Next, the supporting substrate 350 on which a tape 320 is disposed is prepared, and then a bottom surface of the second lead frame 240 is attached to the tape 320. One surface of the tape 320 may include an adhesive member for adhering to the second lead frame 240 and the second semiconductor chips 220.

Then, the second semiconductor chip 220 is mounted on the tape 320, and another second semiconductor chip 220 is mounted on the second semiconductor chip 220 by using the second adhesion layer 210. The second semiconductor chips 220 may include an integrated circuit. Also, the second semiconductor chips 220 may be memory chips or non-memory chips. Although FIG. 12 shows the plurality of second semiconductor chips 220 stacked on the tape 320, the present invention is not limited thereto. That is, only one second semiconductor chip 220 may be stacked on the tape 320.

The active surfaces of the second semiconductor chips 220 may include a plurality of second pads 222 connected to the integrated circuits included in the second semiconductor chips 220. The second pad 222 may be formed of a metal, for example, Al, Cu, Ag, Au, Pd, or the like.

Next, the second pads 222 of the second semiconductor chips 220 mounted on the one surface of the tape 320 may be electrically connected to the second inner leads 242 by using the second connecting members 230. The second connecting members 230 may be, for example, a bonding wire or the like. A plating layer having a predetermined area may be formed on a top surface of each second inner lead 242 to electrically connect the second inner leads 242 and the second connecting members 230. In this regard, the plating layer may be an Ag plating layer.

Next, the second molding member 250 of the second package 20 may be formed to cover the second semiconductor chips 220 and the second inner leads 242. The second dam bar 246 prevents the second molding member 250 from leaking out of the second inner leads 242 during the molding process of the second semiconductor chips 220. Also, the second dam bar 246 supports the entire second lead frame 240 including the second inner leads 242 and the second outer leads 244 that are arranged at both sides of the second dam bar 246.

The second molding member 250 may cover the second semiconductor chips 220 and the second inner leads 242 to protect the second semiconductor chips 220 and the second inner leads 242. The second molding member 250 may be formed of any of various synthetic resins including an epoxy resin, a hardening agent, an organic/inorganic filler, and the like, and may be formed in a mold by using an injection molding method. The second molding member 250 may be formed of a polymer such as a resin, for example, EMC.

Referring to FIGS. 12 and 13, the second dam bar 246 and the second outer leads 244 may be cut by performing a trimming process using a blade, a laser, or other molds.

By cutting the second dam bar 246 and the second outer leads 244, the second package 20 may electrically separate each of the second inner leads 242.

Next, the tape 320 and the supporting substrate 350 are removed from the second package 20. However, the present invention is not limited thereto. That is, the order of performing the process of cutting the second dam bar 246 and the second outer leads 244 and the process of removing the tape 320 and the supporting substrate 350 may be changed according to a way of performing the processes.

Then, an electrical test of the second package 20 is performed on the second inner leads 242 by using a test pin (not shown). The electrical test may be a simple test, for example, a DC test, or a full test regarding a function of the second package 20. The second package 20 that may not pass the electrical test may be discarded.

Figure 14:
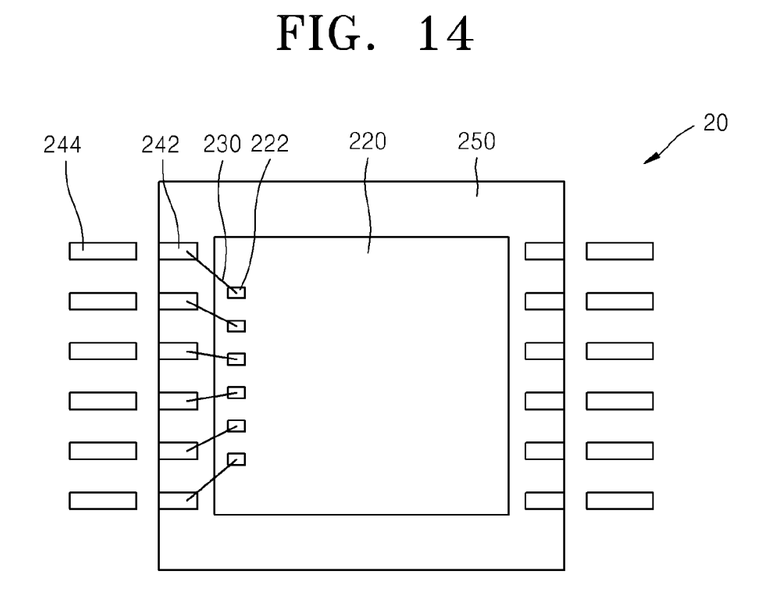
FIG. 14 is a plane view schematically showing the second package of FIG. 13.

FIG. 14 is a plane view schematically showing the second package 20 of FIG. 13.

Referring to FIGS. 13 and 14, the second outer leads 244 and the second dam bar 246 are removed by cutting the second lead frame 240 of the second package 20.

FIG. 15 is a cross-sectional view schematically showing the semiconductor package 1 in which the first package 10 and the second package 20 are electrically connected to each other.

Referring to FIG. 15, the first package 10 and the second package 20 may be electrically connected to each other by using the conductive adhesive member 30.

The conductive adhesive member 30 may be formed on the bottom surfaces of the first inner leads 142 of the first package 10. Alternatively, the conductive adhesive member 30 may be formed on the bottom surfaces of the second inner leads 242 of the second package 20.

The conductive adhesive member 30 may be, for example, a solder paste or conductive epoxy, but the present invention is not limited thereto. The solder paste or the conductive epoxy may be sprayed onto the bottom surfaces of the first inner leads 142 and the second inner leads 242, or may be printed on the bottom surfaces of the first inner leads 142 and the second inner leads 242 by using a screen printer.

The inactive surface of the lowermost first semiconductor chip 120 and the inactive surface of the lowermost second semiconductor chip 220 face each other by the conductive adhesive member 30, and may be disposed spaced apart by an interval corresponding to the thickness of the conductive adhesive member 30. Also, the filling material 35 may be interposed between the inactive surface of the lowermost first semiconductor chip 120 and the inactive surface of the lowermost second semiconductor chip 220.

Next, a forming process for bending the first outer leads 144 of the first package 10 into a predetermined shape is performed.

Then, a full test including testing a function of the semiconductor package 1 is performed. The full test is performed to ascertain whether the semiconductor package 1 has a defect. If it is ascertained that the semiconductor package 1 has a defect, it is determined which one between the first package 10 and second package 20 has a defect, and then a rework process may be performed. In other words, in the semiconductor package 1 of the current embodiment, the first inner leads 142 of the first package 10 and the second inner leads 242 of the second package 20 are coupled to each other by using the conductive adhesive member 30. Thus, for example, when the second package 20 has a defect, the first package 10 and the second package 20 may be removed from the semiconductor package 1. The first package 10 removed from the semiconductor package 1 may be coupled to another second package 20 having passed the full test by using the conductive adhesive member 30.

Also, a process of applying heat to the semiconductor package 1 having passed the full test and the semiconductor package 1 having passed the full test through a rework process may be performed to enhance adhesion between the first package 10 and the second package 20.

In addition, the order of the forming process and the full test with respect to the semiconductor package 1 may be changed.

In the semiconductor package 1 of the current embodiment, a plurality of semiconductor chips are not stacked on a top surface and a bottom surface of a single lead frame or a single substrate, and the first package 10 and the second package 20 are independently formed. Also, the first package 10 and the second package 20 may be coupled to each other by using the conductive adhesive member 30 interposed between the first inner leads 142 and the second inner leads 242.

Accordingly, the first package 10 and the second package 20 may be easily separated from each other, and the first package 10 and the second package 20 that have been separated from each other may be coupled to another normal package to form the semiconductor package 1.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor package comprising:
a first package comprising a first semiconductor chip, a plurality of first inner leads electrically connected to the first semiconductor chip, and a plurality of first outer leads extending from the first inner leads and electrically connected to an external apparatus;
a second package comprising a second semiconductor chip and a plurality of second inner leads and no outer leads, the second inner leads electrically connected to the second semiconductor chip;
a first molding member formed to cover all of the active surface of the first semiconductor chip and the first inner leads and to expose the inactive surface and the first outer leads of the first semiconductor chip; and
a second molding member formed to expose surfaces of the second inner leads and the inactive surface of the second semiconductor chip and to cover top surfaces of the second inner leads and all of the active surface of the second semiconductor chip;
wherein an inactive surface of the first semiconductor chip and an inactive surface of the second semiconductor chip face each other, and the first inner leads contact the second inner leads to be electrically connected to each other;
wherein the first semiconductor chip comprises a plurality of first semiconductor chips, and the first semiconductor chips are in contact with each other and stacked.

2. The semiconductor package of claim 1, wherein the plurality of first inner leads are disposed to surround the first semiconductor chip.

3. The semiconductor package of claim 1, wherein the plurality of second inner leads are disposed to surround the second semiconductor chip.

4. The semiconductor package of claim 1, wherein bottom surfaces of the first inner leads and the inactive surface of the first semiconductor chip are formed on the same level.

5. The semiconductor package of claim 1, wherein bottom surfaces of the second inner leads and the inactive surface of the second semiconductor chip are formed on the same level.

6. The semiconductor package of claim 1, wherein there are a plurality of the second semiconductor chips and the second semiconductor chips are in contact with each other and stacked.

7. A semiconductor package comprising:
a first package comprising a first semiconductor chip, a plurality of first inner leads electrically connected to the first semiconductor chip, and a plurality of first outer leads extending from the first inner leads and electrically connected to an external apparatus;
a second package comprising a second semiconductor chip and a plurality of second inner leads and no outer leads, the second inner leads electrically connected to the second semiconductor chip;
a first molding member formed to cover all of the active surface of the first semiconductor chip and the first inner leads and to expose the inactive surface and the first outer leads of the first semiconductor chip; and
a second molding member formed to expose surfaces of the second inner leads and the inactive surface of the second semiconductor chip and to cover top surfaces of the second inner leads and all of the active surface of the second semiconductor chip;
wherein an inactive surface of the first semiconductor chip and an inactive surface of the second semiconductor chip face each other, and the first inner leads contact the second inner leads to be electrically connected to each other;
wherein the second semiconductor chip comprises a plurality of second semiconductor chips and the second semiconductor chips are in contact with each other and stacked.

8. The semiconductor package of claim 7, wherein the plurality of first inner leads are disposed to surround the first semiconductor chip.

9. The semiconductor package of claim 7, wherein the plurality of second inner leads are disposed to surround the second semiconductor chip.

10. The semiconductor package of claim 7, wherein bottom surfaces of the first inner leads and the inactive surface of the first semiconductor chip are formed on the same level.

11. The semiconductor package of claim 7, wherein bottom surfaces of the second inner leads and the inactive surface of the second semiconductor chip are formed on the same level.

* * * * *